United States Patent
Kanada

(10) Patent No.: US 9,529,056 B2
(45) Date of Patent: Dec. 27, 2016

(54) BATTERY SYSTEM AND DETERIORATION DETERMINING METHOD

(75) Inventor: Ryo Kanada, Toyohashi (JP)

(73) Assignee: Toyota Jidosha Kabushiki Kaisha, Toyota-shi, Aichi (JP)

(*) Notice: Subject to any disclaimer, the term of this patent is extended or adjusted under 35 U.S.C. 154(b) by 259 days.

(21) Appl. No.: 14/370,802

(22) PCT Filed: Feb. 17, 2012

(86) PCT No.: PCT/JP2012/001064
§ 371 (c)(1),
(2), (4) Date: Jul. 7, 2014

(87) PCT Pub. No.: WO2013/121466
PCT Pub. Date: Aug. 22, 2013

(65) Prior Publication Data
US 2015/0153424 A1 Jun. 4, 2015

(51) Int. Cl.
*G01N 27/416* (2006.01)
*G01R 31/36* (2006.01)
*H01M 10/42* (2006.01)
*H01M 10/48* (2006.01)

(52) U.S. Cl.
CPC ....... *G01R 31/3679* (2013.01); *G01R 31/3662* (2013.01); *H01M 10/42* (2013.01); *H01M 10/48* (2013.01)

(58) Field of Classification Search
USPC ............... 324/426, 430; 340/636.11
See application file for complete search history.

(56) References Cited

U.S. PATENT DOCUMENTS

2010/0241376 A1* 9/2010 Kikuchi ............... B60K 6/445
702/63

FOREIGN PATENT DOCUMENTS

| JP | 2010-60406 | | 3/2010 |
| JP | 2010066229 | A * | 3/2010 |
| JP | 2010232080 | A * | 10/2010 |

* cited by examiner

*Primary Examiner* — Richard Isla Rodas
*Assistant Examiner* — David V Henze-Gongola
(74) *Attorney, Agent, or Firm* — Finnegan, Henderson, Farabow, Garrett & Dunner, LLP

(57) ABSTRACT

A battery system includes a secondary battery and a controller. A battery voltage of the secondary battery is more susceptible to a positive electrode potential than to a negative electrode potential. The controller acquires a relationship between a resistance change rate and a current value in the secondary battery in a less charged state and determines the deterioration state of the secondary battery based on the acquired relationship. The controller determines the deterioration state of the secondary battery by using a first correlation and a second correlation. In the first correlation, the resistance change rate is reduced as the current value is increased when only deterioration due to wear of the secondary battery (wear deterioration) occurs. In the second correlation, the resistance change rate is increased as the current value is increased when only deterioration due to a salt concentration distribution within the secondary battery (high rate deterioration) occurs.

9 Claims, 8 Drawing Sheets

BATTERY SYSTEM AND DETERIORATION DETERMINING METHOD

CROSS-REFERENCE TO RELATED APPLICATIONS

This is a U.S. national phase application based on the PCT International Patent Application No. PCT/JP2012/001064, filed Feb. 17, 2012, the entire contents of which are incorporated herein by reference.

TECHNICAL FIELD

The present invention relates to a battery system and a deterioration determining method capable of detecting deterioration due to salt concentration distribution.

BACKGROUND ART

Patent Document 1 has described a technology for estimating the degree of increase of battery resistance produced in a large-current region in a secondary battery. Specifically, a battery model is used to estimate a battery current from a battery voltage, and the degree of increase of battery resistance is estimated on the basis of the estimated battery current and a measured battery current.

PRIOR ART DOCUMENT

Patent Documents

Patent Document 1: Japanese Patent Laid-Open No. 2010-060406

DISCLOSURE OF THE INVENTION

Problems to be Solved by the Invention

Since the technology described in Patent Document 1 employs the battery model, the processing of estimating the degree of increase of battery resistance is complicated. Deterioration of the secondary battery includes deterioration occurring from wear of the secondary battery and the deterioration occurring in the large-current region as described in Patent Document 1. The present applicants have found that the deterioration due to the wear and the deterioration occurring in the large-current region involve different changes in internal resistance of the secondary battery when the secondary battery is in a particular state.

Means for Solving the Problems

A battery system according to a first aspect of the present invention includes a secondary battery and a controller. A battery voltage of the secondary battery is more susceptible to a positive electrode potential than to a negative electrode potential. The controller acquires a relationship between a resistance change rate and a current value in the secondary battery in a less charged state and determines the deterioration state of the secondary battery based on the acquired relationship.

The controller determines the deterioration state of the secondary battery by using a first correlation and a second correlation. In the first correlation, the resistance change rate is reduced as the current value is increased when only deterioration due to wear of the secondary battery occurs. In the second correlation, the resistance change rate is increased as the current value is increased when only deterioration due to a salt concentration distribution within the secondary battery occurs.

In the secondary battery having the battery voltage more susceptible to the positive electrode potential than to the negative electrode potential, the deterioration due to the wear and the deterioration due to the salt concentration distribution have different relationships (first correlation and second correlation) between the resistance change rate and the current value. The use of the first correlation and the second correlation allows the determination of the occurrence of the deterioration due to the wear or the deterioration due to the salt concentration distribution.

In acquiring the relationship between the resistance change rate and the current value, the charged state of the secondary battery can be set to a level lower than 50%. Thus, the first correlation and the second correlation can be used to determine the occurrence of the deterioration due to the wear or the deterioration due to the salt concentration distribution.

When only the deterioration due to the wear occurs, the acquired relationship coincides with the first correlation. When the deterioration due to the salt concentration distribution occurs in addition to the deterioration due to the wear, the acquired relationship is deviated from the relationship between the resistance change rate and the current value specified from the first correlation. Consequently, the deviation can be checked to determine that the deterioration due to the salt concentration distribution occurs.

When the deterioration due to the salt concentration distribution occurs, processing of eliminating the salt concentration distribution can be performed. The deterioration due to the salt concentration distribution can be eliminated by performing particular processing. The deterioration due to the wear, however, can not be eliminated by performing particular processing. When the acquired relationship is deviated by a predetermined amount or more from the relationship between the resistance change rate and the current value specified from the first correlation, it can be determined that the deterioration due to the salt concentration distribution is advanced.

In the secondary battery in a more charged state, the resistance change rate is increased above 1 as the deterioration is advanced. Thus, the resistance change rate is acquired in the secondary battery in the more charged state, and when the acquired resistance change rate is higher than 1, it can be determined that the deterioration of the secondary battery occurs. When it is determined that the deterioration of the secondary battery occurs, the occurrence of the deterioration due to the wear or the deterioration due to the salt concentration distribution can be determined as described above. For achieving the more charged state of the secondary battery, the charged state of the secondary battery can be set to a level equal to or higher than 50%.

The secondary battery can be a secondary battery in which a proportion of a second ratio to a first ratio is higher than a proportion of a third ratio. The first ratio refers to a change amount of the battery voltage relative to a predetermined change amount of a capacity. The second ratio refers to a change amount of the positive electrode potential relative to the predetermined change amount of the capacity. The third ratio refers to a change amount of the negative electrode potential relative to the predetermined change amount of the capacity.

The secondary battery can be mounted on a vehicle. An electric power output from the secondary battery can be converted into a kinetic energy for running the vehicle.

According to a second aspect, the present invention provides a deterioration determining method of determining the deterioration state of a secondary battery having a battery voltage more susceptible to a positive electrode potential than to a negative electrode potential. First, a relationship between a resistance change rate and a current value is acquired in the secondary battery in a less charged state. Then, the deterioration state of the secondary battery is determined from the acquired relationship by using the first correlation and the second correlation described in the first aspect of the present invention. The second aspect of the present invention can achieve the same advantages as those in the first aspect.

MODE FOR CARRYING OUT THE INVENTION

Embodiments of the present invention will hereinafter be described.
Embodiment 1
First, the configuration of a secondary battery is described. For example, a nickel metal hydride battery or a lithium-ion battery can be used as the secondary battery. The secondary battery can be mounted, for example on a vehicle, and the output from the secondary battery can be used to run the vehicle. A plurality of secondary batteries (cells) can be connected in series to constitute an assembled battery in order to satisfy the output requirement of the vehicle.

Figure 1:
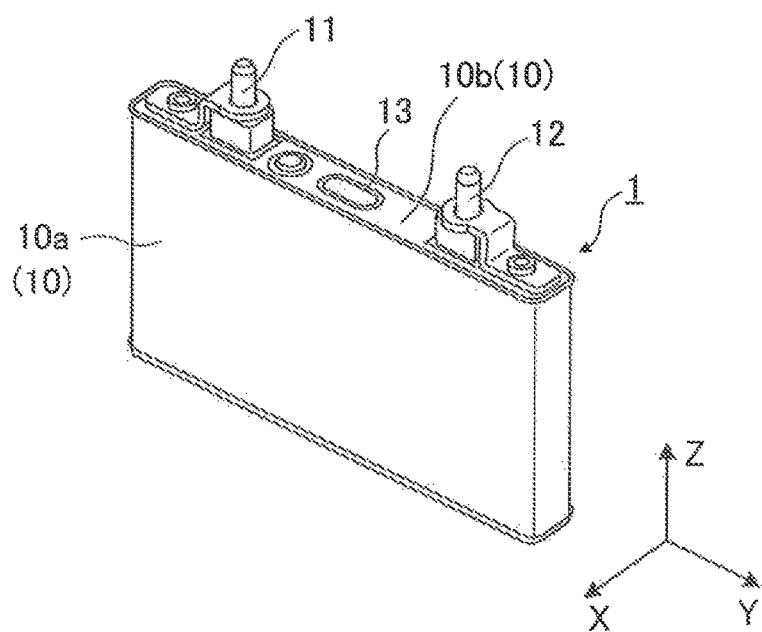
FIG. 1 is an external view of a secondary battery.
Figure 2:
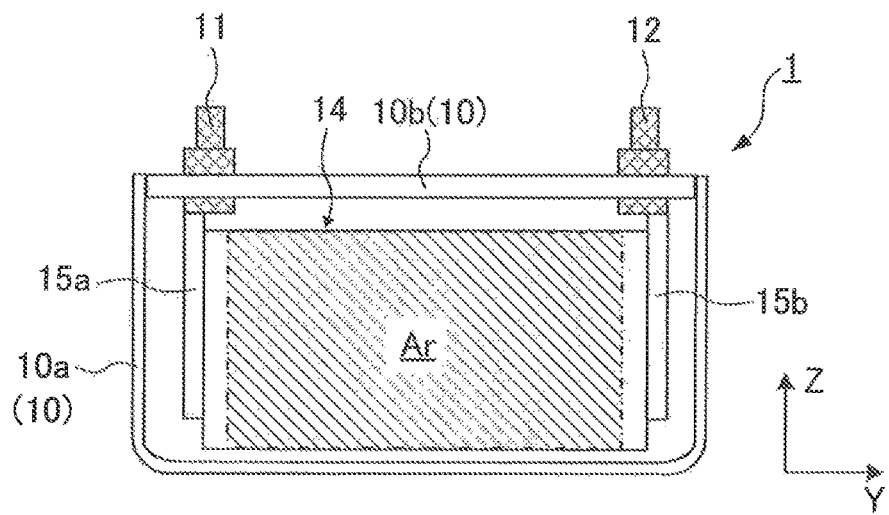
FIG. 2 is a diagram showing the internal structure of the secondary battery.
Figure 4:
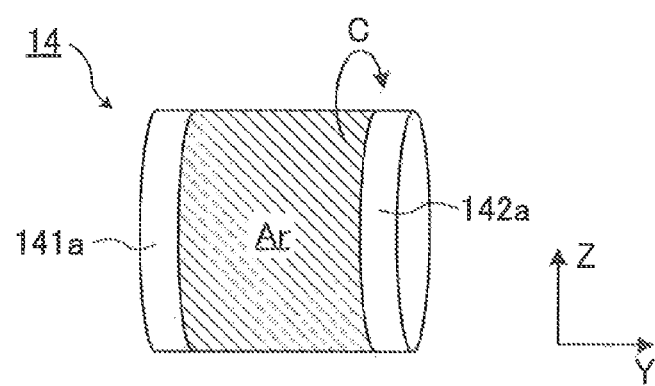
FIG. 4 is an external view of the power-generating element.

FIG. 1 is an external view of the secondary battery. FIG. 2 shows the internal structure of the secondary battery. In FIG. 1 and FIG. 2, an X axis, a Y axis, and a Z axis are axes orthogonal to each other. The relationship between the X axis, the Y axis, and the Z axis applies to the other figure (FIG. 4).

The secondary battery 1 has a battery case 10 and a power-generating element 14 housed in the battery case 10. The battery case 10 can be formed of metal, for example, and has a case body 10a and a lid 10b. The case body 10a has an opening portion for incorporating the power-generating element 14, and the lid 10b covers the opening portion of the case body 10a. This hermetically seals the battery case 10. The lid 10b and the case body 10a can be fixed, for example by welding.

A positive electrode terminal 11 and a negative electrode terminal 12 are fixed to the lid 10b. The positive electrode terminal 11 is connected to the power-generating element 14 through a positive electrode tab 15a, and the negative electrode terminal 12 is connected to the power-generating element 14 through a negative electrode tab 15b. The lid 10b is provided with a valve 13. The valve 13 is used to release gas to the outside of the battery case 10 when the gas is produced within the battery case 10. Specifically, when the production of the gas causes the internal pressure of the battery case 10 to reach the operating pressure of the valve 13, the valve 13 is changed from a closed state to an open state to release the gas to the outside of the battery case 10.

While the secondary battery 1 of a so-called square type is shown in FIG. 1 and FIG. 2, the present invention is not limited thereto. Specifically, the secondary battery 1 of a so-called cylindrical type can be used. In the secondary battery of the square type, the battery case 10 is formed to conform to a rectangle. In the secondary battery 1 of the cylindrical type, the battery case 10 is formed in a cylindrical shape.

Figure 3:
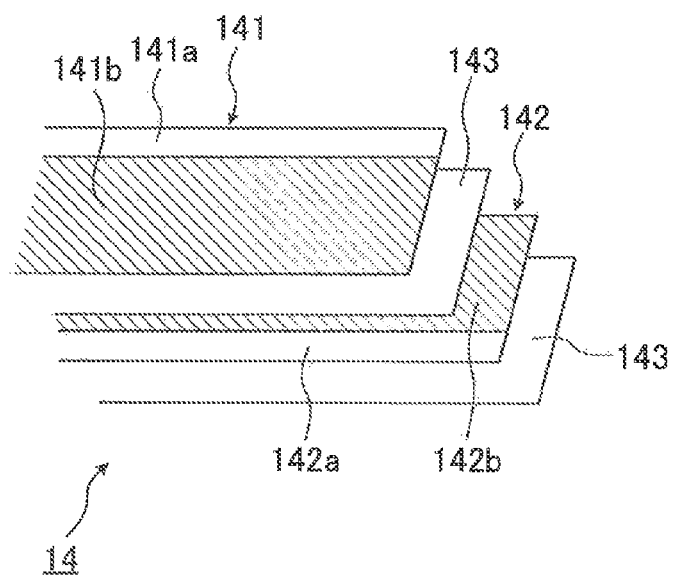
FIG. 3 is a developed view of a power-generating element.

FIG. 3 is a developed view of the power-generating element 14. The power-generating element 14 has a positive electrode plate 141, a negative electrode plate 142, and a separator 143. The positive electrode plate 141 has a collector plate 141a and a positive electrode active material layer 141b formed on a surface of the collector plate 141a. The positive electrode active material layer 141b includes a positive electrode active material, a conductive agent, a binder and the like. The positive electrode active material layer 141b is formed in a part of the collector plate 141a, and the remaining area of the collector plate 141a is exposed.

The negative electrode plate 142 has a collector plate 142a and a negative electrode active material layer 142b formed on a surface of the collector plate 142a. The negative electrode active material layer 142b includes a negative electrode active material, a conductive agent, a binder and the like. The negative electrode active material layer 142b is formed in a part of the collector plate 142a, and the remaining area of the collector plate 142a is exposed. The positive electrode active material layer 141b, the negative electrode active material layer 142b, and the separator 143 are impregnated with an electrolyte solution. While the electrolytic solution is used in the present embodiment, a solid electrolyte can be used instead of the electrolytic solution.

The positive electrode plate 141, the negative electrode plate 142, and the separator 143 are stacked in the order shown in FIG. 3, and the stack is wound in a direction indicated by an arrow C in FIG. 4, thereby forming the power-generating element 14. In FIG. 4, only the collector plate 141a of the positive electrode plate 141 is wound at one end of the power-generating element 14 in the Y direction. As described with reference to FIG. 2, the positive electrode tab 15a is fixed to that collector plate 141a. Only the collector plate 142a of the negative electrode plate 142 is wound at the other end of the power-generating element 14 in the Y direction. The negative electrode tab 15b is fixed to that collector plate 142a.

An area Ar shown in FIG. 2 and FIG. 4 (referred to as a reaction area) corresponds to the area in which the positive electrode active material layer 141b and the negative electrode active material layer 142b overlap each other, and serves as the area in which a chemical reaction occurs when charge and discharge of the secondary battery 1 are performed.

For example, in discharge of the lithium-ion battery serving as the secondary battery 1, a chemical reaction involving release of lithium ions and electrons occurs at an interface of the negative electrode active material, and a chemical reaction involving absorption of the lithium ions and the electrons occurs at an interface of the positive electrode active material. In charge of the lithium-ion battery, a reaction reverse to that in the discharge occurs. The positive electrode plate 141 and the negative electrode plate 142 pass the lithium ions between them through the separator 143 to perform the charge and discharge of the lithium-ion battery.

It is known that the secondary battery 1 is deteriorated, and the deterioration includes a deterioration component due to wear and a deterioration component due to a salt concentration distribution. The deterioration component due to wear is produced from wear of the material forming the secondary battery 1. The material forming the secondary battery 1 is worn with the temperature of the secondary battery 1, the SOC (State of Charge), and elapsed time, for example. The SOC refers to a proportion of the present charge capacity to the full charge capacity of the secondary battery 1. In the present specification, the deterioration due to the wear is referred to as wear deterioration.

The deterioration component due to the salt concentration distribution is a component which increases the internal resistance of the secondary battery 1 when the salt concentration (for example, a lithium salt concentration in the lithium-ion battery) is unbalanced within the secondary battery 1. The unbalanced salt concentration is more likely to occur as the rate in charge and discharge of the secondary battery 1 is higher. In the present specification, the deterioration due to the salt concentration distribution is referred to as high rate deterioration.

When the deterioration of the secondary battery 1 is advanced, the internal resistance of the secondary battery 1 is typically increased. The deterioration of the secondary battery 1 can be evaluated by using a resistance change rate dR. The resistance change rate dR refers to a value calculated by dividing an internal resistance Rc of the secondary battery 1 in the deteriorated state by an internal resistance Rini of the secondary battery 1 in the initial state, and is represented by the following expression (1).

$$dR = \frac{Rc}{Rini} \tag{1}$$

The initial state refers to a state used as the reference in evaluating the deterioration of the secondary battery 1, and for example, can be set to a state immediately after the manufacture of the secondary battery 1. The deterioration of the secondary battery 1 is not present in the state immediately after the manufacture of the secondary battery 1. When the internal resistance Rc is higher than the internal resistance Rini, the resistance change rate dR is higher than 1.

In some cases, the resistance change rate dR may be lower than 1 in a low-SOC region in the secondary battery 1. The low-SOC region refers to a region in which the SOC ranges from 0% to 50%. On the other hand, in a high-SOC region different from the low-SOC region, the resistance change rate dR is higher than 1. The high-SOC region refers to a region in which the SOC ranges from 50% to 100%.

Figure 5:
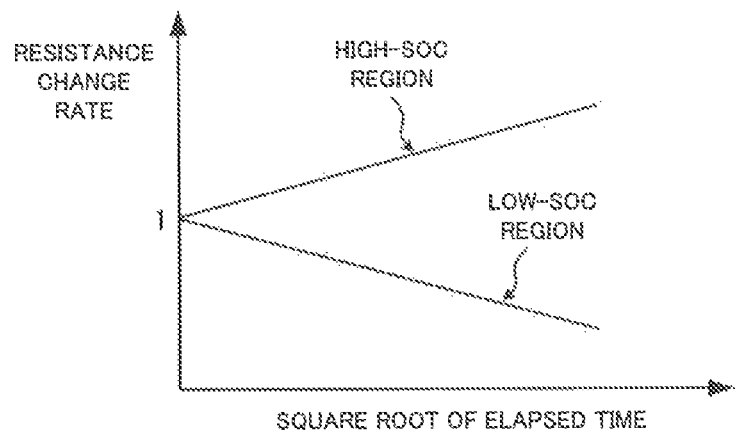
FIG. 5 is a graph showing the relationship between the resistance change rate of the secondary battery and the square root of elapsed time.

FIG. 5 shows the relationship between the resistance change rate dR and the square root of elapsed time. The resistance change rate dR and the square root of elapsed time often have a proportional relationship. In FIG. 5, the vertical axis represents the resistance change rate dR which is higher toward the top in FIG. 5. In FIG. 5, the horizontal axis represents the square root of elapsed time which indicates the lapse of a longer time toward the right in FIG. 5. In the low-SOC region, the resistance change rate dR is further reduced below 1 as the time elapses. On the other hand, in the high-SOC region, the resistance change rate dR is further increased above 1 as the time elapses.

Description will be made of the phenomenon in which the resistance change rate dR is reduced as the time elapses in the low-SOC region.

Figure 6:
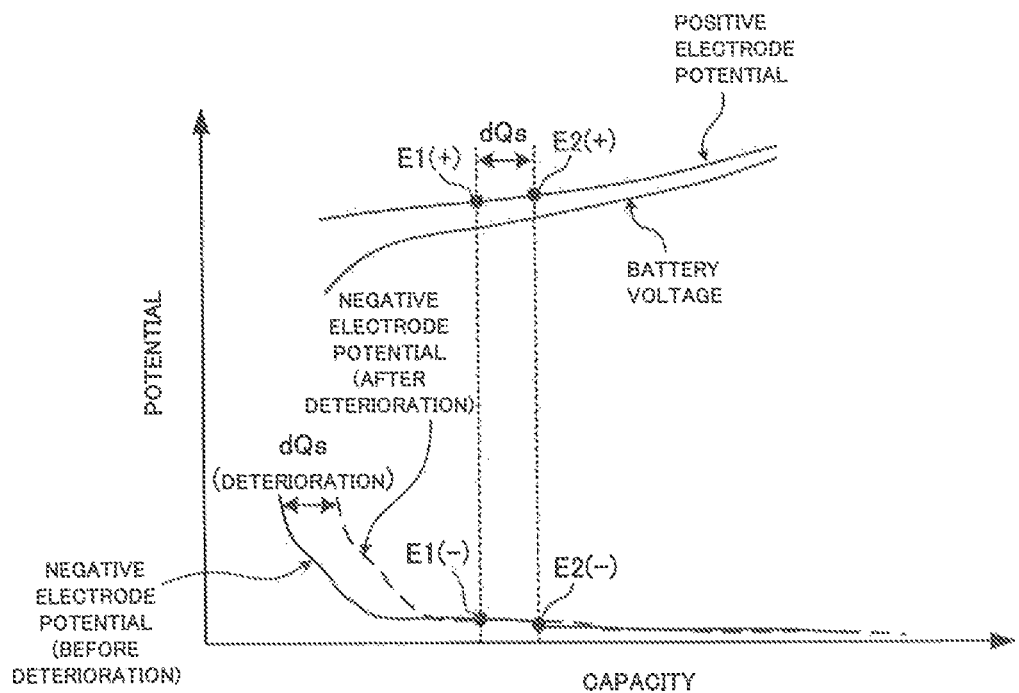
FIG. 6 is a graph showing the relationship between a positive electrode potential, a negative electrode potential, and a battery voltage.

The voltage of the secondary battery 1 (battery voltage) is represented by a difference between a positive electrode potential and a negative electrode potential. FIG. 6 shows the relationship between the battery voltage, the positive electrode potential, and the negative electrode potential. In FIG. 6, the horizontal axis represents the capacity of the secondary battery 1, and the vertical axis represents the potential. As shown in FIG. 6, the positive electrode potential and the battery voltage are increased as the capacity of the secondary battery 1 is increased. On the other hand, the negative electrode potential is increased as the capacity of the secondary battery 1 is reduced.

When the wear deterioration occurs in the secondary battery 1, the correspondence between the positive electrode potential and the negative electrode potential is changed. Specifically, the positive electrode potential and the negative electrode potential are relatively shifted in a left-right direction in FIG. 6.

In the example shown in FIG. 6, the negative electrode potential is shifted relative to the positive electrode potential. Specifically, the negative electrode potential is shifted toward a higher capacity (toward the right in FIG. 6) due to the wear deterioration. If the negative electrode potential is fixed, the positive electrode potential is shifted toward a lower capacity (toward the left in FIG. 6) due to the wear deterioration.

The negative electrode potential before the occurrence of the wear deterioration is shown by a solid line in FIG. 6, and the negative electrode potential after the occurrence of the wear deterioration is shown by a dotted line in FIG. 6. In FIG. 6, dQs represents the shift of the capacity in the negative electrode potential. When no wear deterioration occurs and the SOC of the secondary battery 1 has a particular value, the voltage of the secondary battery 1 is represented by a difference between a positive electrode potential E1 (+) and a negative electrode potential E1 (−).

When the negative electrode potential is shifted by dQs relative to the positive electrode potential due to the occurrence of the wear deterioration, the voltage of the secondary battery 1 at the particular value of the SOC is represented by a difference between a positive electrode potential E2 (+) and a negative electrode potential E2 (−). Since the positive electrode potential is higher as the capacity is higher, the positive electrode potential E2 (+) is higher than the positive electrode potential E1 (+).

Since the internal resistance of the secondary battery 1 is reduced as the positive electrode potential is higher, the internal resistance of the secondary battery 1 is reduced even when the SOC of the secondary battery 1 remains at the particular value. The reduction in the internal resistance of the secondary battery 1 causes the resistance change rate dR to be lower than 1.

When the positive electrode potential has a larger influence than that of the negative electrode potential on the voltage of the secondary battery 1 in the low-SOC region, the resistance change rate dR is lower than 1. Description is now made of a method (by way of example) of determining which of the negative electrode potential and the positive electrode potential has a larger influence on the voltage of the secondary battery 1 with reference to FIG. 7.

First, a voltage Vb_ref of the secondary battery 1 when the SOC is 0% is specified. Next, the following expressions (2) to (4) are defined when the voltage of the secondary battery 1 is changed from the voltage Vb_ref to a voltage Vb_a. The voltage Vb_a is higher than the voltage Vb_ref, and can be set to a value calculated by multiplying the voltage Vb_ref by 1.1, for example.

$$\left(\frac{dVb}{dQ}\right)_{Vb\_ref \to Vb\_a} \quad (2)$$

$$\left(\frac{dV+}{dQ}\right)_{Q0 \to Q1} \quad (3)$$

$$\left(\frac{dV-}{dQ}\right)_{Q0 \to Q1} \quad (4)$$

In the above expressions (3) and (4), Q0 represents the capacity when the voltage of the secondary battery 1 is Vb_ref, and Q1 represents the capacity when the voltage of the secondary battery 1 is Vb_a. The difference between the capacities Q0 and Q1 is dQ. In the above expression (2), dVb represents the change amount of the voltage of the secondary battery 1 when the capacity is changed from Q0 to Q1, and corresponds to the difference between the voltage Vb_ref and the voltage Vb_a. In the above expression (3), dV+ represents the change amount of the positive electrode potential when the capacity is changed from Q0 to Q1. In the above expression (4), dV− represents the change amount of the negative electrode potential when the capacity is changed from Q0 to Q1.

The above expression (2) corresponds to a first ratio in the present invention, the above expression (3) corresponds to a second ratio in the present invention, and the above expression (4) corresponds to a third ratio in the present invention.

Next, the change amount of the negative electrode potential relative to the change amount of the voltage of the secondary battery 1 is calculated on the basis of the following expression (5). The numerator of the right side of the following expression (5) corresponds to the above expression (4), and the denominator of the right side of the following expression (5) corresponds to the above expression (2).

$$B = \left| \frac{\left(\frac{dV-}{dQ}\right)_{Q0 \to Q1}}{\left(\frac{dVb}{dQ}\right)_{Vb\_ref \to Vb\_a}} \right| \quad (5)$$

When a ratio B shown in the above expression (5) is higher than 0.5, the influence of the negative electrode potential on the voltage of the secondary battery 1 is larger than that of the positive electrode potential. On the other hand, when the ratio B shown in the above expression (5) is lower than 0.5, the influence of the positive electrode potential on the voltage of the secondary battery 1 is larger than that of the negative electrode potential.

While the above expression (5) represents the change amount of the negative electrode potential relative to the change amount of the voltage of the secondary battery 1, the present invention is not limited thereto. Specifically, it is possible to use an expression representing the change amount of the positive electrode potential relative to the change amount of the voltage of the secondary battery 1. In this case, the change amount of the positive electrode potential shown in the above expression (3) can be used as the numerator of the right side of the above expression (5) instead of the change amount of the negative electrode potential shown in the above expression (4).

When a ratio representing the change amount of the positive electrode potential relative to the change amount of the voltage of the secondary battery 1 is higher than 0.5, the influence of the positive electrode potential on the voltage of the secondary battery 1 is larger than that of the negative electrode potential. When the ratio representing the change amount of the positive electrode potential relative to the change amount of the voltage of the secondary battery 1 is lower than 0.5, the influence of the negative electrode potential on the voltage of the secondary battery 1 is larger than that of the positive electrode potential.

Figure 7:
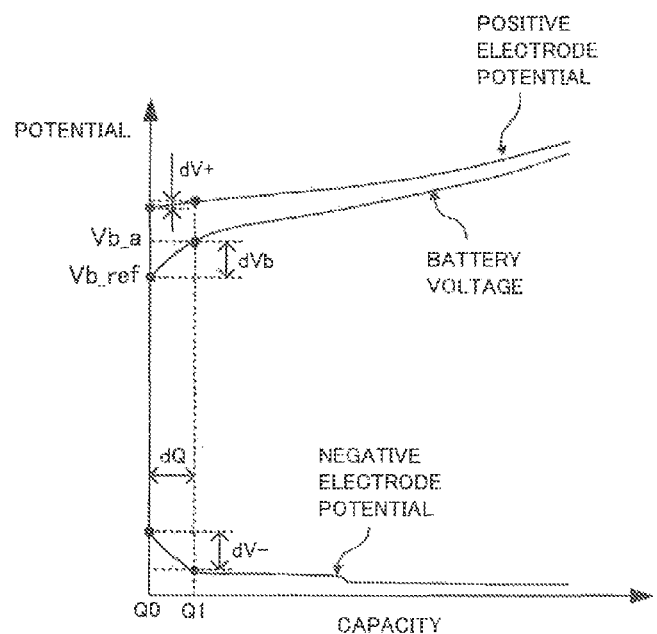
FIG. 7 is a graph for explaining a method of determining the influences of the positive electrode potential and the negative electrode potential on the battery voltage.

The relationship between the negative electrode potential and the capacity shown in FIG. 7 depends on the material forming the negative electrode plate 142 (especially, the negative electrode active material layer 142b) and an irreversible capacity of the secondary battery 1. Thus, the influences of the positive electrode potential and the negative electrode potential on the voltage of the secondary battery 1 depend on the material of the negative electrode plate 142 and the irreversible capacity.

The irreversible capacity refers to the difference between a capacity when the secondary battery 1 is first charged and a capacity when the secondary battery 1 is later discharged. In the first charge of the secondary battery 1, a favorable SEI (Solid Electrolyte Interface) may be formed on the surface of the electrode, or part of the reaction material (lithium in the lithium-ion battery) may be introduced to an area which can not contribute to the charge and discharge reaction. Since these phenomena are irreversible reactions, the capacity when the secondary battery 1 is first charged is different from the capacity when the secondary battery 1 is later discharged. Assuming that the irreversible reaction does not occur, the charge capacity and the discharge capacity are equal to each other.

Figure 8:
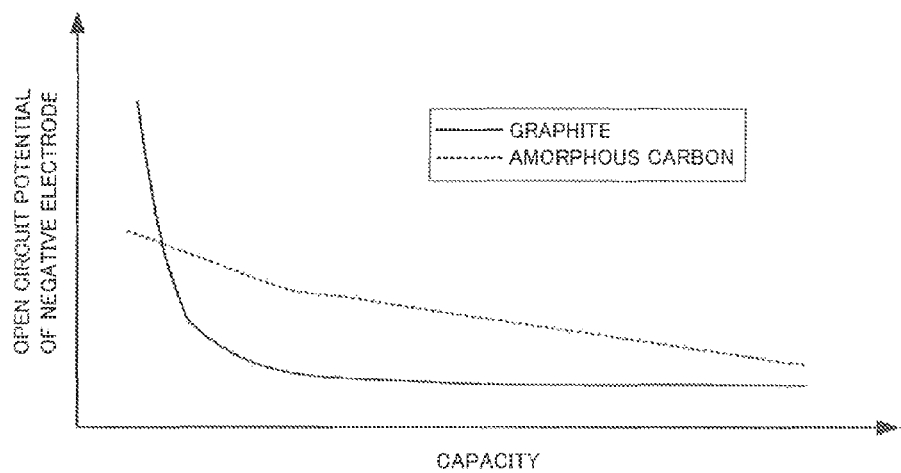
FIG. 8 is a graph showing the open circuit potential of the negative electrode in the negative electrodes made of different materials.

FIG. 8 shows the relationship (by way of example) between the open circuit potential of the negative electrode and the capacity when each of amorphous carbon and graphite is used as the material of the negative electrode active material layer 142b (negative electrode active material). As shown in FIG. 8, different relationships between the open circuit potential of the negative electrode and the capacity are found in amorphous carbon and graphite.

Figure 9:
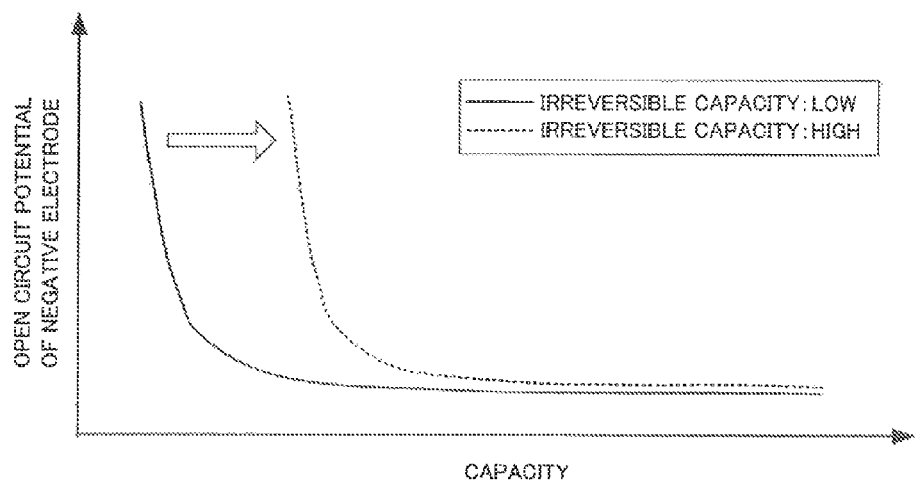
FIG. 9 is a graph for explaining the relationship between the open circuit potential of the negative electrode and an irreversible capacity.

FIG. 9 shows the relationship between the open circuit potential of the negative electrode and the capacity for different irreversible capacities. In FIG. 9, graphite is used as the negative electrode active material layer 142b (negative electrode active material). As shown in FIG. 9, the open circuit potential of the negative electrode is shifted toward a higher capacity (toward the right in FIG. 9) as the irreversible capacity is higher.

Figure 10:
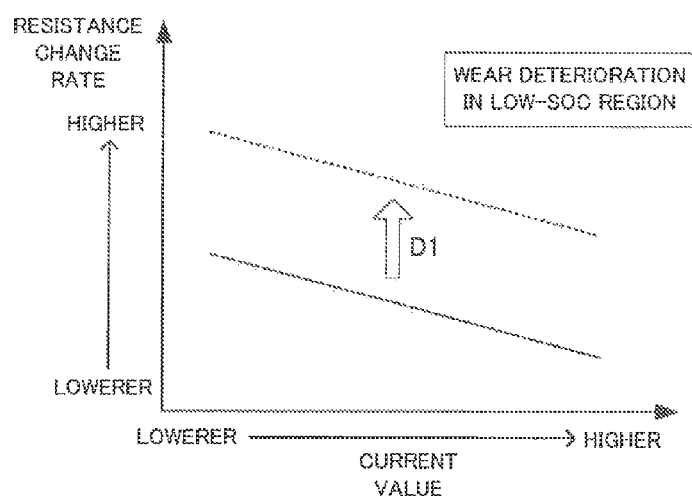
FIG. 10 is a graph showing the relationship between the resistance change rate and the current value when wear deterioration occurs in a low-SOC region.

As shown in FIG. 10, in the secondary battery 1 in which the resistance change rate dR is reduced, the reduction amount of the resistance change rate dR is changed with the current value of the secondary battery 1. As the current value is higher, the reduction amount of the resistance change rate dR is larger. FIG. 10 shows the relationship between the resistance change rate dR and the current value when the wear deterioration occurs in the low-SOC region. As shown in FIG. 10, since the resistance change rate dR is lower as the current value is higher, the current value and the resistance change rate dR have a negative correlation (corresponding to a first correlation). While FIG. 10 shows the relationship between the current value and the resistance change rate dR with a linear function, it may be represented with a quadratic function or the like.

As the wear deterioration is advanced, the straight line representing the relationship between the current value and the resistance change rate dR is shifted in a direction indicated by an arrow D1 in FIG. 10. A dotted line shown in FIG. 10 represents the relationship between the current value and the resistance change rate dR when the wear deterioration reaches the upper limit of the range in which the deterioration is allowed. As the wear deterioration is more advanced, the straight lint representing the relationship between the current value and the resistance change rate dR is only shifted in the direction in which the resistance change rate dR is increased. The slope of the straight line representing the relationship between the current value and the resistance change rate dR remains the same regardless of the degree of the advancement of the wear deterioration.

Figure 11:
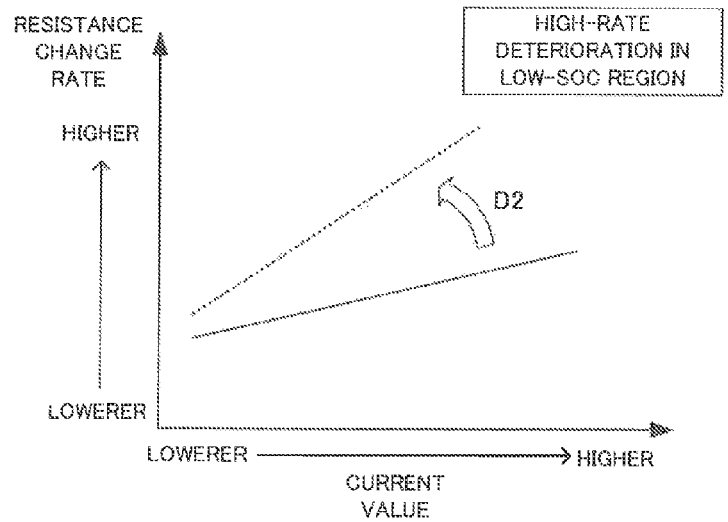
FIG. 11 is a graph showing the relationship between the resistance change rate and the current value when high rate deterioration occurs in the low-SOC region.

When the high rate deterioration occurs in the low-SOC region, the resistance change rate dR is higher as the current value is larger as shown in FIG. 11. In FIG. 11, the horizontal axis represents the current value which is higher toward the right in FIG. 11. In FIG. 11, the vertical axis represents the resistance change rate dR which is higher toward the top in FIG. 11. As apparent from FIG. 11, when the high rate deterioration occurs, the current value and the resistance change rate dR have a positive correlation (corresponding to a second correlation). While FIG. 11 shows the relationship between the current value and the resistance change rate dR with a linear function, it may be represented with a quadratic function or the like.

Since the high rate deterioration is easily advanced as the current value is higher, the slope of the straight line representing the relationship between the current value and the resistance change rate dR is increased as shown by an arrow D2 in FIG. 11 when the high rate deterioration is advanced. The high rate deterioration indicated by a dotted line in FIG. 11 is more advanced than the high rate deterioration indicated by a solid line in FIG. 11. The dotted line shown in FIG. 11 represents the relationship between the current value and the resistance change rate dR when the high rate deterioration reaches the upper limit of the range in which the high rate deterioration is allowed.

As described above, the current value and the resistance change rate dR have the negative correlation when the wear deterioration occurs in the low-SOC region, and the current value and the resistance change rate dR have the positive correlation when the high rate deterioration occurs. These correlations can be monitored to determine whether or not the high rate deterioration occurs.

Since the high rate deterioration occurs due to an unbalanced salt concentration, the high rate deterioration can be easily eliminated by removing the unbalanced salt concentration. An example of processing for suppressing the high rate deterioration (deterioration suppressing processing) will hereinafter be described. The suppression of the high rate deterioration can maintain the input/output characteristics of the secondary battery 1 or can extend the life of the secondary battery 1. It should be noted that the wear deterioration involves the wear of the material forming the secondary battery 1, so that the wear deterioration can not be eliminated.

In first deterioration suppressing processing, when the unbalanced salt concentration occurs due to discharge of the secondary battery 1, the unbalanced salt concentration can be eliminated by charging the secondary battery 1. On the other hand, when the unbalanced salt concentration occurs due to charge of the secondary battery 1, the unbalanced salt concentration can be eliminated by discharging the secondary battery 1.

Whether the salt concentration distribution occurs due to the discharge of the secondary battery 1 or the charge of the secondary battery 1 can be determined from the history of current values acquired when the secondary battery 1 is charged and discharged. For example, when the cumulative value of discharge currents is higher than the cumulative value of charge currents, it can be determined that the salt concentration distribution occurs due to the discharge. On the other hand, when the cumulative value of the charge currents is higher than the cumulative value of the discharge currents, it can be determined that the salt concentration distribution occurs due to the charge.

In second deterioration suppressing processing, the input/output (charge/discharge) of the secondary battery 1 can be limited to suppress the advancement of the unbalance of the salt concentration. For controlling the discharge of the secondary battery 1, the upper limit electric power associated with the discharge is set to control the discharge of the secondary battery 1 such that the discharge electric power of the secondary battery 1 does not exceed the upper limit electric power. For controlling the charge of the secondary battery 1, the upper limit electric power associated with the charge is set to control the charge of the secondary battery 1 such that the charge electric power of the secondary battery 1 does not exceed the upper limit electric power.

For limiting the output (discharge) of the secondary battery 1, the upper limit electric power associated with the discharge can be lowered. For limiting the input (charge) of the secondary battery 1, the upper limit electric power associated with the charge can be lowered. The lowered upper limit electric power can limit the value of the current passing through the secondary battery 1 to suppress the advancement of the high rate deterioration.

In third deterioration suppressing processing, the discharge time or the charge time of the secondary battery 1 can be shortened to suppress the advancement of the unbalance of the salt concentration. When the secondary battery 1 is continuously discharged or continuously charged, the unbalance of the salt concentration is advanced. Thus, the discharge time and the charge time can be shortened to suppress the advancement of the unbalance of the salt concentration.

In fourth deterioration suppressing processing, the secondary battery 1 can be heated to suppress the high rate deterioration. Since the internal resistance of the secondary battery 1 is higher as the temperature is lower, the secondary battery 1 can be heated to suppress an increase in internal resistance of the secondary battery 1. The internal resistance of the secondary battery 1 can be prevented from being easily increased in this manner to suppress the high rate deterioration.

Figure 12:
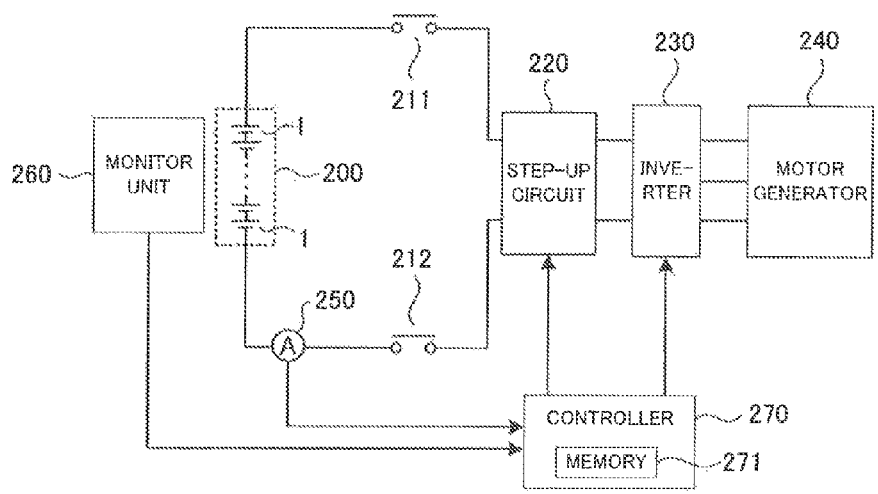
FIG. 12 is a diagram showing the configuration of a battery system.

Next, a method of determining the high rate deterioration is described. First, description is made of the configuration of a system for determining the high rate deterioration with reference to FIG. 12. A battery system shown in FIG. 12 can be used in a vehicle.

An assembled battery 200 has a plurality of secondary batteries (cells) 1 connected in series. The assembled battery 200 is connected to a step-up circuit 220 through system main relays 211 and 212. The step-up circuit 220 increases an output voltage of the assembled battery 200. The step-up circuit 220 is connected to an inverter 230 which converts a DC power from the step-up circuit 220 into an AC power. While the step-up circuit 220 is used in the battery system of the present embodiment, the step-up circuit 220 may be omitted.

A motor generator 240 receives the AC power from the inverter 230 to generate a kinetic energy for running of the vehicle. The kinetic energy generated by the motor generator 240 is transferred to wheels. A three-phase AC motor can be used as the motor generator 240.

For decelerating or stopping the vehicle, the motor generator 240 converts a kinetic energy produced in braking of the vehicle into an electric energy (AC power). The AC power generated by the motor generator 240 is converted into a DC power by the inverter 230. The step-up circuit 220 reduces the output voltage of the inverter 230 and supplies the electric power after reducing voltage to the assembled battery 200. Thus, the regenerative power can be stored in the assembled battery 200.

A current sensor 250 detects a current passing through the assembled battery 200 and outputs the detection result to a controller 270. For the current value detected by the current sensor 250, a positive value can be used for a discharge current and a negative value can be used for a charge current. A monitor unit 260 detects the voltage of the secondary battery 1 and outputs the detection result to the controller 270.

The monitor unit 260 can be used to detect the voltage of the assembled battery 200. When the plurality of secondary batteries 1 constituting the assembled battery 200 are divided into a plurality of blocks, the voltage of each of the blocks can be detected by using the monitor unit 260. Each block includes at least two secondary batteries 1.

The controller 270 controls the operations of the system main relays 211 and 212, the step-up circuit 220, and the inverter 230. The controller 270 has a memory 271. The memory 271 has a program for operating the controller 270 and various types of information stored therein. While the controller 270 contains the memory 271 in the present embodiment, the memory 271 may be provided outside the controller 270.

When an ignition switch of the vehicle is switched from OFF to ON, the controller 270 switches the system main relays 211 and 212 from OFF to ON and operates the step-up circuit 220 and the inverter 230. When the ignition switch is switched from ON to OFF, the controller 270 switches the system main relays 211 and 212 from ON to OFF and the stops the operations of the step-up circuit 220 and the inverter 230.

Figure 13:
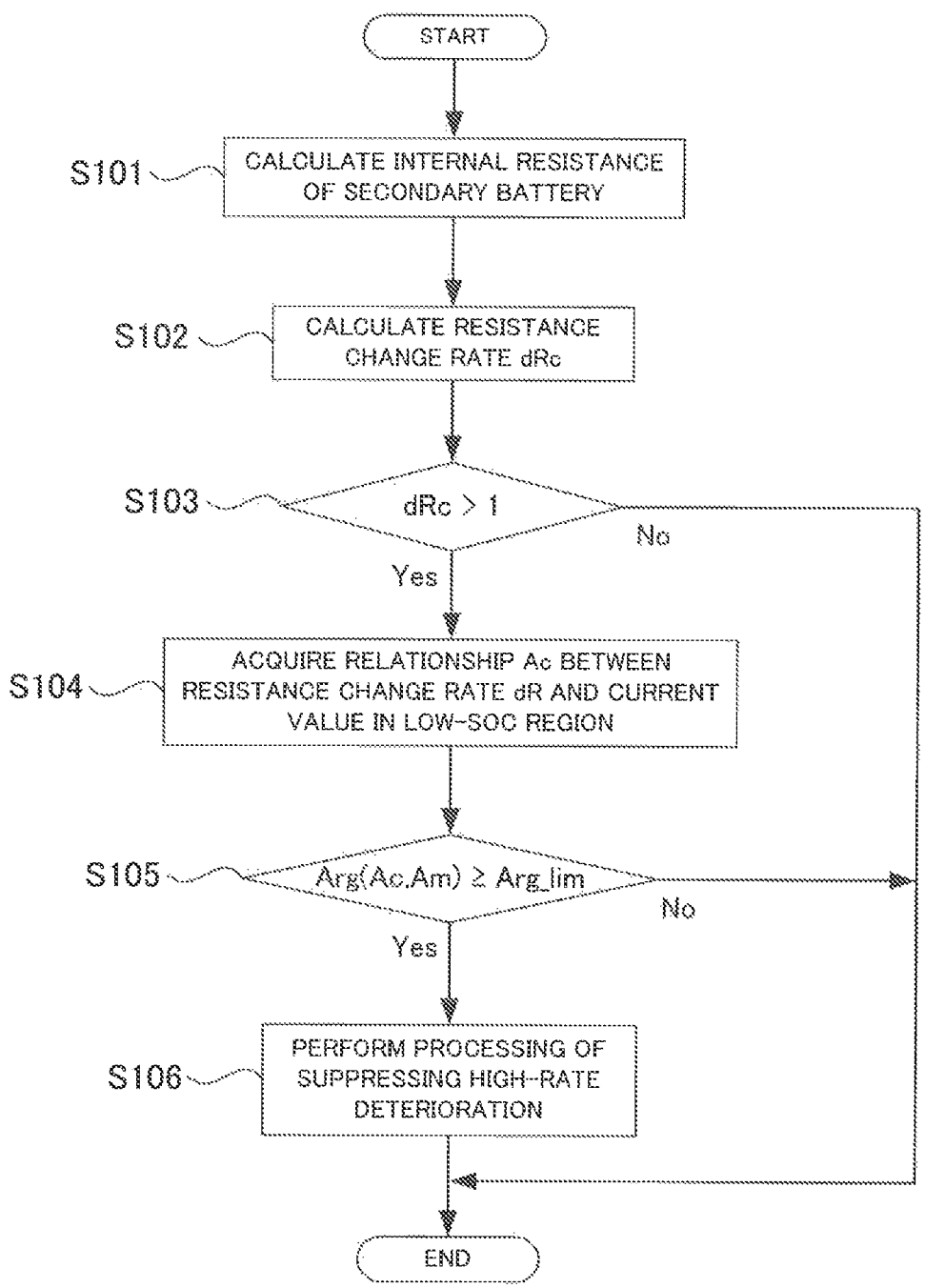
FIG. 13 is a flow chart showing processing of determining the high rate deterioration.

Next, the processing of determining the high rate deterioration is described with reference to a flow chart shown in FIG. 13. The processing shown in FIG. 13 is performed by the controller 270.

At step S101, the controller 270 calculates the internal resistance of the secondary battery 1. In the calculation of the internal resistance of the secondary battery 1, the SOC of the secondary battery 1 is set to the SOC included in the high-SOC region. The internal resistance of the secondary battery 1 can be calculated from the voltage value and the current value of the secondary battery 1. The controller 270 can acquire the voltage value of the secondary battery 1 based on the output from the monitor unit 260. The controller 270 can acquire the current value of the secondary battery 1 based on the output from the current sensor 250.

At step S102, the controller 270 calculates the resistance change rate dRc from the internal resistance of the secondary battery 1 calculated at step S101. The internal resistance Rini of the secondary battery 1 in the initial state can be previously determined by experiment or the like and stored in the memory 271. The controller 270 can substitute the internal resistance Rini read from the memory 271 and the internal resistance Rc calculated at step S101 into the above expression (1) to calculate the resistance change rate dRc.

The internal resistance of the secondary battery 1 may be changed with the temperature of the secondary battery 1. When information indicating the correspondence between the internal resistance Rini and the temperature is previously determined, the temperature of the secondary battery 1 can be acquired to specify the internal resistance Rini associated with that temperature. The temperature of the secondary battery 1 can be acquired with a temperature sensor. The information indicating the correspondence between the internal resistance Rini and the temperature can be stored in the memory 271. The information indicating the correspondence between the internal resistance Rini and the temperature can be represented as a map or a function.

At step S103, the controller 270 determines whether or not the resistance change rate dRc calculated at step S102 is higher than 1. The resistance change rate dRc calculated at step S102 is the resistance change rate dRc acquired when the SOC of the secondary battery 1 is included in the high-SOC region. Thus, the resistance change rate dRc is higher than 1 when the secondary battery 1 is deteriorated. For this reason, it can be determined whether or not the secondary battery 1 is deteriorated by determining whether or not the resistance change rate dRc is higher than 1.

When the resistance change rate dRc is higher than 1, the controller 270 determines that the secondary battery 1 is deteriorated, and performs processing at step S104. On the other hand, when the resistance change rate dRc is equal to or lower than 1, the controller 270 determines that the secondary battery 1 is not deteriorated, and ends the processing shown in FIG. 13. If the resistance change rate dRc approaches the upper limit value, the input/output of the secondary battery 1 can be limited to suppress the increase in the resistance change rate dRc. The upper limit value can be previously defined on the basis of the input/output performance of the secondary battery 1 or the like.

At step S104, the controller 270 specifies a relationship Ac between the resistance change rate dR of the secondary battery 1 and the current value in the state in which the SOC of the secondary battery 1 is included in the low-SOC region.

Specifically, the controller 270 first discharges the secondary battery 1 such that the SOC of the secondary battery 1 is included in the low-SOC region. The discharge of the secondary battery 1 can reduce the SOC of the secondary battery 1 to include the SOC of the secondary battery 1 in the low-SOC region. If the SOC of the secondary battery 1 is already included in the low-SOC region, the discharge of the secondary battery 1 is not required.

Next, the controller 270 changes the current value of the secondary battery 1 and calculates the resistance change rate dR for each current value. Specifically, the controller 270 calculates the internal resistance of the secondary battery 1 for each current value and calculates the resistance change rate dR based on the calculated internal resistance and the internal resistance Rini in the initial state. The acquired current value and resistance change rate dR can be plotted on a coordinate system shown in FIG. 14 to provide the relationship (straight line) Ac between the current value and the resistance change rate dR.

Figure 14:
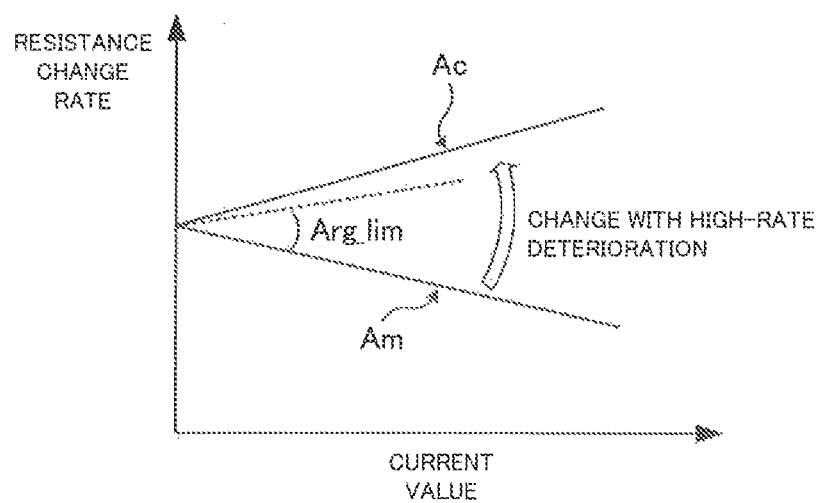
FIG. 14 is a graph showing the relationship between the resistance change rate and the current value in the secondary battery.

FIG. 14 shows the state in which the wear deterioration and the high rate deterioration occur in the secondary battery 1, and the relationship Ac between the current value and the resistance change rate dR have a positive correlation. If the high rate deterioration does not occur, the relationship between the current value and the resistance change rate dR has a negative correlation.

At step S105, the controller 270 determines whether or not the condition in the following expression (6) is satisfied.

$$Arg(Ac, Am) \geq Arg\_lim \quad (6)$$

In the above expression (6), Am represents the straight line indicating the relationship between the current value and the resistance change rate dR when only the wear deterioration occurs. Am can be previously determined by experiment or the like. For example, since the wear deterioration is advanced with the lapse of time, the correspondence between the elapsed time and Am can be previously determined such that the specification of the elapsed time can specify Am. In addition, the temperature and the SOC of the secondary battery 1 may be previously considered in order to specify Am. Information indicating the correspondence between the elapsed time and Am can be previously stored in the memory 271. The correspondence between the elapsed time and Am can be represented as a map or a function.

In the above expression (6), Arg(Ac,Am) represents an argument of Ac with respect to Am. Arg_lim represents a value associated with Arg (Ac,Am) and is the upper limit value of the range in which Arg (Ac,Am) is allowed. Arg(Ac,Am) is the value which specifies the high rate deterioration. As described above, since the current value and the resistance change rate dR have the positive correlation when the high rate deterioration occurs, the occurrence of the high rate deterioration increases the argument Arg(Ac,Am) to be larger than 0.

The argument Arg(Ac,Am) larger than 0 can be used to determine that the high rate deterioration occurs. In other words, the occurrence of the high rate deterioration can be determined by checking that Ac is deviated from Am.

Errors of Ac and Am can be taken into account to set the condition for determining that the high rate deterioration occurs. Specifically, the occurrence of the high rate deterioration can be determined when the argument Arg (Ac,Am) is equal to or larger than a predetermined value. The predetermined value is a value larger than 0 and can be previously set in view of the errors of Ac and Am.

Arg_lim is the upper limit value to which the high rate deterioration is allowed, and can be set as appropriate by taking account of the properties of the secondary battery 1 and the like. In the present embodiment, the range in which the high rate deterioration is allowed is set, and Arg_lim is a value larger than 0. Information about Arg_lim can be stored in the memory 271. For preventing the occurrence of the high rate deterioration, Arg_lim may be set to 0 or a value determined by considering the errors of Ac and Am.

When Arg (Ac, Am) is equal to or larger than Arg_lim, the controller 270 determines that the high rate deterioration needs to be suppressed, and performs processing at step S106. FIG. 14 shows the state in which Arg(Ac,Am) is larger than Arg_lim. On the other hand, when Arg(Ac,Am) is smaller than Arg_lim, the controller 270 determines that the suppression of the high rate deterioration is not required, and ends the processing shown in FIG. 13.

At step A106, the controller 270 performs the processing of suppressing the high rate deterioration. For example, the deterioration suppressing processing described above can be performed as the processing of suppressing the high rate deterioration. When the deterioration suppressing processing changes the high rate deterioration toward the elimination thereof, Arg(Ac,Am) is reduced.

As described above with reference to FIG. 11, the slope of the resistance change rate dR relative to the current value is increased as the high rate deterioration is more advanced. Thus, the advancement state of the high rate deterioration can be specified from the slope of the resistance change rate dR relative to the current value. In performing the processing of suppressing the high rate deterioration, the operation of the deterioration suppressing processing can be changed in view of the advancement state of the high rate deterioration. For example, in changing the upper limit electric power used in charge and discharge control of the secondary battery 1, the upper limit power can be reduced as the high rate deterioration is more advanced.

The processing of suppressing the high rate deterioration may be started when Arg(Ac,Am) approaches Arg_lim. Specifically, as Arg(Ac,Am) approaches Arg_lim, the operation of the deterioration suppressing processing can be changed stepwise. For example, in changing the upper limit electric power used in charge and discharge control of the secondary battery 1, the upper limit electric power can be reduced as Arg(Ac,Am) is closer to Arg_lim.

The condition on which the deterioration suppressing processing is started can be set as appropriate. For example, the deterioration suppressing processing can be started when Arg(Ac,Am) reaches Arg_s. Arg_s is a value smaller than Arg_lim, and can be a value included in the range from the value calculated by multiplying Arg_lim by 0.5 to Arg_lim.

The invention claimed is:

1. A battery system comprising:
   a secondary battery which has a battery voltage that is influenced more by the positive electrode potential than the negative electrode potential;
   a voltage sensor which detects a voltage value of the battery;
   a current sensor which detects a current value of the current passing through the battery; and
   a controller which calculates the internal resistance based on the detected voltage and current values, determines the resistance change rate based on the calculated internal resistance value, acquires a relationship between the resistance change rate and the current value detected by the current sensor when a charged state of the secondary battery is in a range lower than 50%, and determines a deterioration state of the secondary battery based on the acquired relationship,
wherein the controller determines the deterioration state of the secondary battery to be deterioration due only to wear of the secondary battery when the resistance change rate is reduced as the current value is increased in accordance with a first correlation, and determines the deterioration state of the secondary battery to be deterioration due only to salt concentration distribution within the secondary battery when the resistance change rate is increased as the current value is increased in accordance with a second correlation.

2. The battery system according to claim 1, wherein the controller determines that the deterioration due to the salt concentration distribution occurs when the acquired relationship is deviated from a relationship between the resistance change rate and the current value specified from the first correlation.

3. The battery system according to claim 2, wherein the controller performs processing of eliminating the salt concentration distribution when the acquired relationship is deviated by a predetermined amount or more from the relationship between the resistance change rate and the current value specified from the first correlation.

4. The battery system according to claim 2, wherein the controller acquires a resistance change rate of the secondary battery in a more fully charged state, wherein the more fully charged state is a range of equal to or higher than 50%, and compares the acquired relationship with the relationship between the resistance change rate and the current value specified from the first correlation when the acquired resistance change rate is higher than 1.

5. The battery system according to claim 1, wherein the secondary battery is a secondary battery in which a proportion of a second ratio indicating a change amount of the positive electrode potential relative to a predetermined change amount of a capacity to a first ratio indicating a change amount of the battery voltage relative to the predetermined change amount of the capacity is higher than a proportion of a third ratio indicating a change amount of the negative electrode potential relative to the predetermined change amount of the capacity.

6. The battery system according to claim 1, wherein the secondary battery is mounted on a vehicle and outputs electric power, the electric power being provided to be converted into kinetic energy for running the vehicle.

7. A deterioration determining method of determining a deterioration state of a secondary battery which has a battery voltage influenced more by the positive electrode potential than the negative electrode potential, comprising:
detecting a voltage value of the battery;
detecting a current value of the current passing through the battery;
calculating the internal resistance based on the detected voltage and current values;
determining the resistance change rate based on the calculated internal resistance value;
acquiring a relationship between the resistance change rate and the current value in the secondary battery when a charged state of the secondary battery is in a range lower than 50%; and
determining a deterioration state of the secondary battery to be deterioration due only to wear of the secondary battery when the resistance change rate is reduced as the current value is increased in accordance with a first correlation, and determining the deterioration state of the secondary battery to be deterioration due only to salt concentration distribution within the secondary battery when the resistance change rate is increased as the current value is increased in accordance with a second correlation.

8. The battery system according to claim 2, wherein the secondary battery is a secondary battery in which a proportion of a second ratio indicating a change amount of the positive electrode potential relative to a predetermined change amount of a capacity to a first ratio indicating a change amount of the battery voltage relative to the predetermined change amount of the capacity is higher than a proportion of a third ratio indicating a change amount of the negative electrode potential relative to the predetermined change amount of the capacity.

9. The battery system according to claim 4, wherein the secondary battery is a secondary battery in which a proportion of a second ratio indicating a change amount of the positive electrode potential relative to a predetermined change amount of a capacity to a first ratio indicating a change amount of the battery voltage relative to the predetermined change amount of the capacity is higher than a proportion of a third ratio indicating a change amount of the negative electrode potential relative to the predetermined change amount of the capacity.

\* \* \* \* \*